United States Patent
Wu et al.

(10) Patent No.: US 11,125,843 B2
(45) Date of Patent: Sep. 21, 2021

(54) METHOD FOR MEASURING PH

(71) Applicant: SHENZHEN INSTITUTES OF ADVANCED TECHNOLOGY, Guangdong (CN)

(72) Inventors: Yin Wu, Guangdong (CN); Hairong Zheng, Guangdong (CN); Xin Liu, Guangdong (CN)

(73) Assignee: SHENZHEN INSTITUTES OF ADVANCED TECHNOLOGY, Guangdong (CN)

( * ) Notice: Subject to any disclaimer, the term of this patent is extended or adjusted under 35 U.S.C. 154(b) by 502 days.

(21) Appl. No.: 16/309,351

(22) PCT Filed: Dec. 29, 2017

(86) PCT No.: PCT/CN2017/120104
§ 371 (c)(1),
(2) Date: Dec. 12, 2018

(87) PCT Pub. No.: WO2019/119517
PCT Pub. Date: Jun. 27, 2019

(65) Prior Publication Data
US 2020/0309885 A1 Oct. 1, 2020

(30) Foreign Application Priority Data
Dec. 18, 2017 (CN) .......................... 201711372590.0

(51) Int. Cl.
*G01R 33/56* (2006.01)

(52) U.S. Cl.
CPC ..... *G01R 33/5601* (2013.01); *G01R 33/5605* (2013.01); *G01R 33/5608* (2013.01)

(58) Field of Classification Search
USPC .......................................................... 600/420
See application file for complete search history.

(56) References Cited

U.S. PATENT DOCUMENTS

| 8,278,925 B2 * | 10/2012 | Sun | G01R 33/4828 324/308 |
| 2015/0323632 A1 * | 11/2015 | Sun | G01R 33/5601 324/309 |

OTHER PUBLICATIONS

Sun, et al., Simultaneous determination of labile proton fraction ratio and exchange rate with irradiation radio frequency (RF) power dependent quantitative CEST MRI analysis, Contrast Media Mol Imaging, 2013; 8(3): 246-251. (Year: 2013).*

(Continued)

*Primary Examiner* — Rodney E Fuller

(57) ABSTRACT

A method for measuring pH includes using amide protons as an endogenous contrast agent, measuring a chemical exchange saturation transfer effect ratio R of amide protons corresponding to a pH-known amide proton solution under different saturation powers, then establishing a function relation between pH and R according to different pH-known amide proton solutions and the corresponding measured R thereto, and finally calculating the desired pH according to experimentally measured $R_t$ and the function relation. The method can eliminate the impact of concentration and does not require any estimation or measurement of the parameters such as the concentration of exchangeable protons, the longitudinal relaxation time of water, etc., and therefore can measure pH more accurately, conveniently and non-invasively.

17 Claims, 2 Drawing Sheets

(56) References Cited

OTHER PUBLICATIONS

Sun et al., "A method for accurate pH mapping with chemical exchange saturation transfer (CEST) MRI", Contrast Media Mol. Imaging, 2015, vol. 11, 9 pages.
Bai et al., "Clinical applications of amide proton transfer magnetic resonance imaging", Chin J Magn Reson Imagin, 2016, vol. 7, No. 4, pp. 259-264.
Melkus et al., "Ex Vivo Porcine Model to Measure pH Dependence of Chemical Exchange Saturation Transfer Effect of Glycosaminoglycan in the Intervertebral Disc", Magnetic Resonance in Medicine, 2013, vol. 71, pp. 1743-1749.
Zhou et al., "Quantitative Chemical Exchange Saturation Transfer MRI of Intervertebral Disc in a Porcine Model", Magnetic Resonance in Medicine, 2016, vol. 76, pp. 1677-1683.
Wu et al., "Research progress in methods of pH measurement in tissue cells", Int J Med Radiol, 2016, vol. 39, No. 4, pp. 410-415.
Zhao et al., "The study of amide proton transfer magnetic resonance imaging", China Medical Device Information, 2014, pp. 17-26.

* cited by examiner

METHOD FOR MEASURING PH

CROSS-REFERENCE TO RELATED APPLICATIONS

This application is a 371 U.S. National Phase Entry Application of PCT/CN2017/120104, filed Dec. 29, 2017, which claims the priority from Chinese Patent Application No. 201711372590.0 filed Dec. 18, 2017, the contents of each of which are incorporated herein by reference.

TECHNICAL FIELD

The present disclosure relates to the biomedical field, and particularly to a method for measuring pH.

BACKGROUND ARTP

Intracellular pH is an important parameter of the acid-base environment of organism tissues, which is closely related to the metabolic state of the organism, and is helpful to the understanding of pathogenesis, development process and prognostic evaluation of diseases.

Chemical exchange saturation transfer (CEST) imaging is a magnetic resonance molecular imaging technique, which is based on the chemical exchange effect between exchangeable protons in an endogenous or exogenous contrast agent and water molecules, and enables the measurement of the chemical exchange rate. Some contrast agents (such as amide protons) are sensitive to pH environment, and their chemical exchange rate thereof is closely related to pH, thus providing a possible way for pH measurement.

The existing methods for measuring intracellular pH have to first measure the pH value of several representative regions in some typical physiological environments (such as eucapnia, hypercapnia and autopsy state) with magnetic resonance spectroscopy (MRS), such as $^{31}$P MRS. pH could be measured as, $pH=6.75+\log\{(\delta-3.26)/(5.70-\delta)\}$, wherein $\delta$ is the chemical shift between inorganic phosphate and phosphocreatine. Then the pH value of each pixel in other physiological environments could be obtained from the relation between CEST effect and pH. The main existing methods for measuring intracellular pH comprise the followings. (1) It has proved that the amide protons are base-catalyzed with pH>5, so the chemical exchange rate thereof can be expressed as $k=k_{base}[OH]=k_{base}\times 10^{PH-pKw}$; in addition, the CEST effect of amide protons is $APTR=k\times f_{amide}\times(1-e^{-R_{1w}\times T_{sat}})/(2\times R_{1w})$, wherein famine is the concentration of amide groups, $R_{1w}$ is the longitudinal relaxation rate of water and $T_{sat}$ is the saturation time. A relation between APTR and pH can be established if the parameters such as pKw and $f_{amide}$ are estimated appropriately. For example, at 4.7 T, the relation between APTR and pH of rat brain tissues is approximately as follows: $APTR=5.73\times 10^{PH-9.4}$. The disadvantage of this method is that the estimation of the parameters such as pKw and $f_{amide}$ has relatively large impact on the subsequent pH quantitation, especially in in vivo imaging, it is difficult to obtain pKw and $f_{amide}$, and thus this method has obvious limitations. (2) Endogenous amine groups (resonance frequency at +2.75 ppm) and amide groups (resonance frequency +3.5 ppm) are used for ratiometric imaging. The CEST effect ratio between the two groups of exchangeable protons is $AACID=k_1T_{1w}f_1/k_2T_{1w}f_2$, wherein k is the exchange rate of each group of exchangeable protons, f is the concentration thereof, and $T_{1w}$ is the longitudinal relaxation time of water. Assuming that amine groups and amide groups are from the same macromolecule, their concentrations thereof are the same, thus AACID is only related to the exchange rate. The relation between AACID and pH could be established as, $pH=-4.0\times AACID+12.8$. However, this method assumes that amine groups and amide groups are from the same macromolecule which cannot be strictly proved. In addition, amine groups generally have a faster chemical exchange rate, and its CEST effect is relatively difficult to be captured under the clinical magnetic field strength, making clinical adoption difficult.

In view of this, the present disclosure has been proposed.

SUMMARY

An object of the present disclosure is to provide a method for measuring pH, which can completely eliminate the impact of concentration and does not require any estimation or measurement of the parameters such as the concentration of exchangeable protons, the longitudinal relaxation time of water, etc., and therefore can measure pH more accurately, conveniently and non-invasively. In addition, amide groups have a relatively low chemical exchange rate, and can be imaged stably under the clinical magnetic field strength, promising for clinical applications.

In order to achieve the above object of the present disclosure, the following technical solution is particularly adopted:

The present disclosure provides a method for measuring pH, wherein with amide protons as an endogenous contrast agent, a chemical exchange saturation transfer effect ratio R of amide protons corresponding to a pH-known amide proton source solution under different saturation pulse intensities is measured, then a function relation between pH and R is established according to different pH-known amide proton source solutions and the corresponding measured R, and finally the desired pH is calculated according to experimentally measured $R_i$ and the function relation, wherein $R_i$ is a chemical exchange saturation transfer effect ratio of amide protons of a phantom to be tested or a tissue to be tested under different saturation pulse powers.

As a further preferred technical solution, the pH of the amide proton source solution is 5.5-8.0.

As a further preferred technical solution, amide proton source solutions having different pH are prepared and then made into phantoms, and then the phantoms are subjected to a chemical exchange saturation transfer imaging experiment under different saturation powers.

As a further preferred technical solution, a frequency offset range of the different saturation pulse intensities comprises ±3.5 ppm.

As a further preferred technical solution, the chemical exchange saturation transfer effect $M_S$ of the amide proton source solution at each pH under different saturation powers is calculated using an asymmetric model, to obtain R.

As a further preferred technical solution, $R=ST(\omega_1)/ST(\omega_2)=\{(M_0-M_{S1})\times M_{S2}\}/\{(M_0-M_{S2})\times M_{S1}\}$; wherein $M_0$ is a signal amplitude when no saturation pulse is applied, $M_{S1}$ and $M_{S2}$ are chemical exchange saturation transfer effects when the saturation pulse amplitudes are $\omega_1$ and $\omega_2$, respectively, with $ST(\omega_1)=(M_0-M_{S1})/M_{S1}$, and $ST(\omega_2)=(M_0-M_{S2})/M_{S2}$.

As a further preferred technical solution, $M_{S1}=\{M_{S1}(-3.5\text{ ppm})-M_{S1}(+3.5\text{ ppm})\}/M_0$; wherein $M_0$ is a signal amplitude when no saturation pulse is applied, $M_{S1}(-3.5\text{ ppm})$ and $M_{S1}(+3.5\text{ ppm})$ are signal amplitudes at −3.5 ppm and +3.5 ppm when a saturation pulse is applied, respectively.

$M_{S2}=\{M_{S2}(-3.5\text{ ppm})-M_{S2}(+3.5\text{ ppm})\}/M_0$; wherein $M_0$ is a signal amplitude when no saturation pulse is applied, $M_{S2}(-3.5\text{ ppm})$ and $M_{S2}(+3.5\text{ ppm})$ are signal amplitudes at −3.5 ppm and +3.5 ppm when a saturation pulse is applied, respectively.

As a further preferred technical solution, the function relation between pH and R refers to the function relation in the monotonically varying interval of pH and R;

preferably, the function relation between pH and R is obtained by third order polynomial fitting.

As a further preferred technical solution, the measurement of R of different pH-known amide proton source solutions and the measurement of $R_i$ are conducted at the same experimental temperature and under the same imaging conditions, and the in vivo experimental temperature is preferably 37° C.

As a further preferred technical solution, the following steps are comprised:

(a) preparing amide proton solution phantoms with different pH;

(b) subjecting the phantoms to a chemical exchange saturation transfer imaging experiment under different saturation powers;

(c) calculating chemical exchange saturation transfer effect $M_S$ of the amide proton solution at each pH under different saturation powers;

(d) calculating a chemical exchange saturation transfer effect ratio R of the amide proton solution at each pH under different saturation powers;

(e) establishing a function relation between pH and R; and (f) conducting a phantom experiment or in vivo experiment to measure $R_i$, and calculating the desired pH according to $R_i$ with the function in Step (e).

Compared with the prior methods, the advantageous effects of the present disclosure are as follows.

In the method for measuring pH provided in the present disclosure, amide protons are used as an endogenous contrast agent, a function relation between pH and R is established by measuring a chemical exchange saturation transfer effect ratio R of amide protons corresponding to a pH-known solution under different saturation powers, and then the desired pH is obtained by calculation according to experimentally measured $R_i$ with the function relation. In this method, since the amide protons involved in the imaging have the same source, the concentrations thereof are the same, then the impact of concentration can be completely eliminated and there is no need to make any estimation or measurement of the parameters such as the concentration of exchangeable protons, the longitudinal relaxation time of water, etc. Therefore, the saturation transfer effect ratio of amide protons under different saturation powers can completely get rid of the dependence on the concentration of amide groups and the longitudinal relaxation time of water, and is only related to the chemical exchange rate, thus enabling more accurate, convenient and non-invasive measurement of pH. In addition, amide groups have a relatively low chemical exchange rate, and can be imaged stably under the clinical magnetic field strength, promising for clinical practices.

The method for measuring pH described above can be applied to the prediction of pathogenesis, prediction of development process or prognostic evaluation of diseases, by which the pH in organism tissue cells can be accurately measured, and which allows for more accurate and convenient prediction of pathogenesis, prediction of development process or prognostic evaluation of diseases.

DETAILED DESCRIPTION OF EMBODIMENTS

Figure 1:
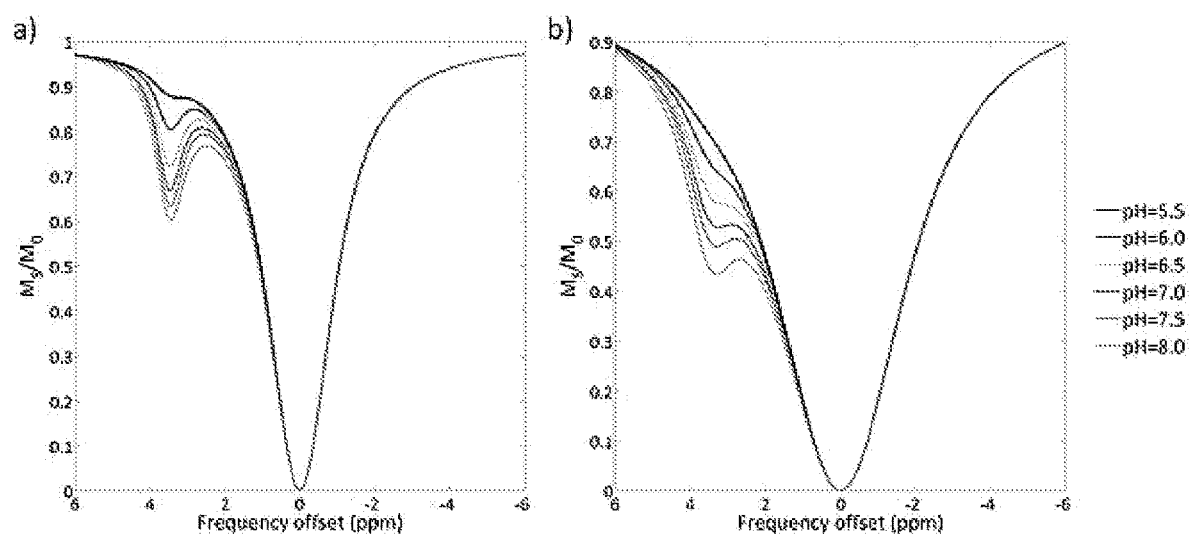
FIG. 1 illustrates Z spectrums generated by solutions having different pH at the saturation pulse intensities of 0.75 μT (a) and 1.5 μT (b) in embodiment 1.

The technical solutions of the present disclosure will be described in detail below in connection with the embodiments, but it will be understood by those skilled in the art that the embodiments described below are only intended to illustrate the present disclosure, but should not be considered as limiting the scope of the present disclosure. The embodiments are carried out in accordance with conventional conditions or conditions recommended by the manufacturer if no specific conditions are specified in the embodiments.

In at least one embodiment, there is provided a method for measuring pH, wherein with amide protons as an endogenous contrast agent, a chemical exchange saturation transfer effect ratio R of amide protons corresponding to a pH-known amide proton source solution under different saturation powers is measured, then a function relation between pH and R is established according to different pH-known amide proton source solutions and the corresponding measured R, and finally the desired pH is calculated according to experimentally measured $R_i$ and the function relation, wherein $R_i$ is a chemical exchange saturation transfer effect ratio of amide protons of a phantom to be tested or a tissue to be tested under different saturation powers.

In the method for measuring pH described above, amide protons are used as an endogenous contrast agent, a function relation between pH and R is established by measuring a chemical exchange saturation transfer effect ratio R of amide protons corresponding to a pH-known solution under different saturation powers, and then the desired pH is calculated according to experimentally measured $R_i$ and the function relation. In this method, since the amide protons involved in the imaging have the same source, the concentrations thereof are the same, then the impact of concentration can be completely eliminated and there is no need to make any estimation or measurement of the parameters such as the concentration of exchangeable protons, the longitudinal relaxation time of water, etc. Therefore, the saturation transfer effect ratio of amide protons under different saturation pulses can completely get rid of the dependence on the concentration of amide groups and the longitudinal relaxation time of water, and is only related to the chemical exchange rate, thus enabling more accurate, convenient and non-invasive measurement of pH. In addition, amide groups have a relatively low chemical exchange rate, and can be imaged stably under the clinically common magnetic resonance field strength, promising for clinical practices.

Endogenous contrast agents are one kind of chemical exchange saturation transfer contrast agents. With intracellular substance as an endogenous contrast agent, and metabolite information is indirectly detected through water signals, so as to perform tissue pH imaging and various tissue metabolite imaging.

The term "amide proton solution" refers to a solution capable of providing amide protons, and the abovementioned "amide proton solution" comprises, but is not limited to, a polylysine solution. The polylysine solution is formed preferably by diluting polylysine to a suitable concentration, comprising, but not limited to, 10 mg/mL, with a phosphate buffer or agarose. Polylysine solutions having different pH are prepared preferably by titration method.

Preferably, the pH of the amide proton source solutions described above is 5.5-8.0, typically but not limited to 5.5, 5.6, 5.7, 5.8, 5.9, 6.0, 6.1, 6.2, 6.3, 6.4, 6.5, 6.6, 6.7, 6.8, 6.9, 7.0, 7.1, 7.2, 7.3, 7.4, 7.5, 7.6, 7.7, 7.8, 7.9 or 8.0. The pH of the amide proton source solutions having different pH comprises, but is not limited to, any combinations of several pH values described above. Preferably, the pH of the amide proton source solutions having different pH is 5.5, 6.0, 6.5, 7.0, 7.5 and 8.0, respectively.

The word "there" in the phrasing "the corresponding measured R thereto" refers to a certain pH-known amide proton solution.

The experimentally measured $R_i$ comprises, but is not limited to, the measured $R_i$ of other phantoms or tissues. The desired pH comprises, but is not limited to, the pH of other phantoms or tissues. It is to be understood that the above-described other phantoms refer to other phantoms than those that may be used in determining the function relation between pH and R; and the above-described tissues refer to organism tissues.

It should be understood that the different saturation powers employed in the test of a pH-known amide proton solution are the same as the different saturation powers employed in the test of a phantom to be tested or a tissue to be tested.

In a preferred embodiment, amide proton solutions having different pH are prepared and then made into phantoms, and then the phantoms are subjected to a chemical exchange saturation transfer imaging experiment under different saturation powers. The chemical exchange saturation transfer imaging is an imaging method with a special contrast ratio based on endogenous or exogenous contrast agents. Chemical exchange saturation transfer imaging is performed by first saturating exchangeable protons with pulses and then imaging hydrogen protons in water by using conventional imaging sequences.

It should be noted that the "preparing of an amide proton solution" comprises, but is not limited to, preparing an amide proton solution with a test tube.

In a preferred embodiment, a frequency offset range of the different saturation pulse intensities comprises ±3.5 ppm. An APT (Amide Proton Transfer) imaging signal is obtained by saturating signals at different chemical shifts and then acquiring water signals. In fact, RF saturation pulses also excite protons at adjacent resonance frequencies, particularly in clinical magnetic fields wherein the resonance frequency of the endogenous contrast agent, amide protons, is very close to that of water molecules, and this may cause direct water saturation effect to overwhelm the APT signals. 3.5 ppm is the chemical shift between amide groups and water molecules, with frequency offset range being −3.5 ppm, and mainly serves to eliminate the impact of direct water saturation effect on amide protons by the method of asymmetric analysis in the subsequent calculation process.

In a preferred embodiment, the chemical exchange saturation transfer effect $M_S$ of the amide proton source solution at each pH under different saturation pulse intensities is calculated using an asymmetric model, respectively, to obtain R. The chemical exchange saturation transfer effect is expressed by the ratio of signals after saturation and before saturation. The graph illustrating the signal ratio varying with chemical shift is called Z spectrum or CEST spectrum. In Z spectrum, images within a certain range of chemical shift are collected to correct the offset of the main magnetic field. Such spectrum, however, contains direct saturation effect close to the water frequency, which will interfere with the detection of CEST. In view of the characteristic that the conventional MT (Magnetization Transfer) effect and the direct water saturation effect on the Z spectrum exhibit a symmetry trend around water, it is feasible to remove the interference caused by the above factors by the method of asymmetric analysis, which is a simple and effective processing method. In this method, a subtraction operation is performed between the signal at the frequency of the exchangeable protons and the signal symmetrical to the resonance frequency of water molecules to eliminate the impact of the direct water saturation effect, to obtain $M_S$ and further obtain R. The calculation method is as follows: $M_S=\{M_S(-3.5\text{ ppm})-M_S(+3.5\text{ ppm})\}/M_0$; wherein $M_0$ is a signal amplitude when no saturation pulse is applied, $M_S(-3.5\text{ ppm})$ and $M_S(+3.5\text{ ppm})$ are signal amplitudes at −3.5 ppm and +3.5 ppm when a saturation pulse is applied, respectively.

In a preferred embodiment, $R=ST(\omega_1)/ST(\omega_2)=\{(M_0-M_{S1})\times M_{S2}\}/\{(M_0-M_{S2})\times M_{S1}\}$; wherein $M_0$ is a signal amplitude when no saturation pulse is applied, $M_{S1}$ and $M_{S2}$ are chemical exchange saturation transfer effects when the saturation powers are on $\omega_1$ and $\omega_2$, respectively, with $ST(\omega_1)=(M_0-M_{S1})/M_{S1}$, and $ST(\omega_2)=(M_0-M_{S2})/M_{S2}$. In this preferred embodiment, R is the ratio of $ST(\omega_1)$ to $ST(\omega_2)$, while $ST(\omega_1)=(M_0-M_{S1})/M_{S1}$, and $ST(\omega_2)=(M_0-M_{S2})/M_{S2}$, the abovementioned specific $ST(\omega_1)$ and $ST(\omega_2)$ can more sufficiently reflect the relation between R and the amide proton exchange rate.

In a preferred embodiment, $M_{S1}=\{M_{S1}(-3.5\text{ ppm})-M_{S1}(+3.5\text{ ppm})\}/M_0$; wherein $M_0$ is a signal amplitude when no saturation pulse is applied, and $M_{S1}(-3.5\text{ ppm})$ and $M_{S1}(+3.5\text{ ppm})$ are signal amplitudes at −3.5 ppm and +3.5 ppm when a saturation pulse is applied, respectively.

$M_{S2}=\{M_{S2}(-3.5\text{ ppm})-M_{S2}(+3.5\text{ ppm})\}/M_0$; wherein $M_0$ is a signal amplitude when no saturation pulse is applied, $M_{S2}(-3.5\text{ ppm})$ and $M_{S2}(+3.5\text{ ppm})$ are signal amplitudes at −3.5 ppm and +3.5 ppm when a saturation pulse is applied, respectively.

In a preferred embodiment, the function relation between pH and R refers to the function relation in the monotonically varying interval of pH and R. The function relation in the monotonically varying interval of pH and R is of more practical significance. The above-mentioned "monotonically varying interval" refers to an interval in which the R-dependent variation of pH exhibits a monotonous increase or a monotonous decrease.

Preferably, the function relation between pH and R is obtained by third order polynomial fitting. Based on practical application, the number of amide proton solutions with different pH will not be excessive, and the fitting accuracy can be ensured by using the third order polynomial fitting. It should be understood that the third order polynomial means that the highest degree of the independent variable is 3, and the third order polynomial is also referred to as a cubic polynomial.

It should be understood that as the number of amide proton source solutions with different pH increases, higher order polynomials or more complex models can also be used for fitting, so that the precision of the resulting fitting curve is higher.

In a preferred embodiment, the measurement of R of different pH-known amide proton source solutions and the measurement of $R_i$ are conducted at the same experimental temperature and under the same imaging conditions, and the in vivo experimental temperature is preferably 37° C. In the case where the measurement of R of different pH-known amide proton source solutions and the measurement of $R_i$ are conducted at the same experimental temperature and under the same imaging conditions, the actual pH can be measured more accurately only when the obtained function relation between pH and R is applied to the measurement of $R_i$. The in vivo experimental temperature being preferably 37° C. serves the purpose of getting adapted to the human body temperature.

In a preferred embodiment, the following steps are comprised:

(a) preparing amide proton solutions with different pH and then making the same into several phantoms;

(b) subjecting the phantoms to a chemical exchange saturation transfer imaging experiment under different saturation powers;

(c) calculating chemical exchange saturation transfer effect $M_S$ of the amide proton source solution at each pH under different saturation powers;

(d) calculating a chemical exchange saturation transfer effect ratio R of the amide proton source solution at each pH under different saturation powers;

(e) establishing a function relation between pH and R; and (f) conducting a phantom experiment or in vivo experiment to measure $R_i$, and calculating the desired pH according to $R_i$ with the function relation in Step (e).

The method for measuring pH described above can be applied to the prediction of pathogenesis, prediction of development process or prognostic evaluation of diseases, can accurately measure the pH in organism tissue cells, and allow for more accurate and convenient prediction of pathogenesis, prediction of development process or prognostic evaluation of diseases.

Embodiment 1

A method for measuring pH, comprising the steps of:

(a) loading a polylysine solution having different pH and then making the same into several phantoms, with the pH being 5.5, 6.0, 6.5, 7.0, 7.5 and 8.0;

(b) subjecting the phantoms to a chemical exchange saturation transfer imaging experiment under different saturation powers;

wherein it is assumed that the chemical exchange rates of the solutions having pH of 5.5, 6.0, 6.5, 7.0, 7.5 and 8.0 are 10, 30, 60, 90, 120 and 180 Hz, respectively, and the concentration of amide protons with respect to water is 1:200, the longitudinal and transverse relaxation time of water is set to 1.2 s and 80 ms respectively, the saturation time of continuous RF pulse is set to 2.4 s, the frequency offset range is set to −6~6 ppm with intervals of 0.1 ppm, and then when the saturation powers are 0.75 µT and 1.5 µT at the magnetic field strength of 3 T, the Z spectrum is as shown in FIG. 1;

(c) calculating chemical exchange saturation transfer effect $M_S$ of the corresponding amide protons in the solution at each pH under different saturation pulse intensities, with $M_S=\{M_S(-3.5\ ppm)-M_S(+3.5\ ppm)\}/M_0$, wherein $M_0$ is a signal amplitude when no saturation pulse is applied, $M_S(-3.5\ ppm)$ and $M_S(+3.5\ ppm)$ are signal amplitudes when a saturation pulse is applied at −3.5 ppm and +3.5 ppm, respectively, and the results being as shown in Table 1;

TABLE 1

Chemical exchange saturation transfer effect corresponding to amide protons in solutions having different pH

| pH | 5.5 | 6.0 | 6.5 | 7.0 | 7.5 | 8.0 |
|---|---|---|---|---|---|---|
| $\omega_1 = 0.75\ \mu T$ | 0.04 | 0.12 | 0.20 | 0.26 | 0.29 | 0.32 |
| $\omega_2 = 1.5\ \mu T$ | 0.03 | 0.09 | 0.15 | 0.20 | 0.24 | 0.30 |

Figure 2:
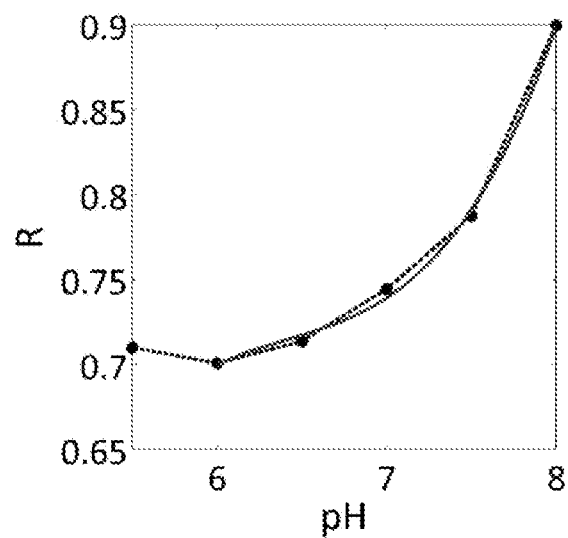
FIG. 2 illustrates the pH-dependent variation of R (dotted line) and the fitted pH correction curve (solid line).

(d) calculating a chemical exchange saturation transfer effect ratio R of the solution at each pH under different saturation powers, with $R=ST(\omega_1)/ST(\omega_2)=\{(M_0-M_{S1})\times M_{S2}\}/\{(M_0-M_{S2})\times M_{S1}\}$, wherein $M_{S1}$ and $M_{S2}$ are chemical exchange saturation transfer effects when the saturation powers are $\omega_1$ and $\omega_2$, respectively, with $ST(\omega_1)=(M_0-M_{S1})/M_{S1}$, and $ST(\omega_2)=(M_0-M_{S2})/M_{S2}$;

(e) studying the relation between the chemical exchange saturation transfer effect ratio R and pH at two saturation powers, and fitting the numerical values in the monotonically varying interval with appropriate functions to establish a function relation between pH and R, wherein as can be seen, when pH is in the range of 6~8, R and pH exhibit a monotonically varying trend, this range covers most of the pH values of organism tissues, a pH calibration curve (solid line) can be obtained by fitting the pH with R using a third order polynomial, as shown in FIG. 2, and the function relation between pH and R after the fitting is $R=0.02*pH^3-0.28*pH^2+1.56*pH-2.22$;

(f) conducting a phantom experiment or in vivo experiment under the same experimental temperature and imaging conditions as in Step (b) to measure $R_i$, and calculating the desired pH according to $R_i$ with the function relation in Step (e), wherein for example, the chemical exchange saturation transfer effects of a phantom/in vivo tissue obtained under the saturation pulses of 0.75 µT and 1.5 µT are 0.24 and 0.19, respectively, then $R_i=0.73$, and based on the pH calibration curve obtained above and the function relation after fitting, it can be obtained that the phantom/in vivo tissue has a pH of 6.9.

Although the present disclosure has been illustrated and described with specific embodiments, it should be appreciated that many other changes and modifications may be made without departing from the spirit and scope of the present disclosure. Therefore, the appended claims are meant to encompass all such variations and modifications falling within the scope of the present disclosure.

The invention claimed is:

1. A method for measuring pH, wherein with amide protons as an endogenous contrast agent, a chemical exchange saturation transfer effect ratio R of amide protons corresponding to a pH-known amide proton solution under different saturation powers is measured, then a function relation between pH and R is established according to different pH-known amide proton solutions and the corresponding measured R thereto, and finally the desired pH is calculated according to experimentally measured $R_i$, and the function relation, wherein $R_i$ is a chemical exchange saturation transfer effect ratio of amide protons of a phantom to be tested or a tissue to be tested under different saturation pulse intensities;

wherein a chemical exchange saturation transfer effect Ms of the amide proton solution at each pH under different saturation powers is calculated using an asymmetric model, to obtain R.

2. The method for measuring pH according to claim 1, wherein the pH of the amide proton solution is 5.5-8.0.

3. The method for measuring pH according to claim 2, comprising steps of:
   (a) preparing amide proton solutions having different pH and then making them into several phantoms;
   (b) subjecting the phantoms to a chemical exchange saturation transfer imaging experiment under different saturation powers;
   (c) calculating chemical exchange saturation transfer effect Ms of the amide proton solution at each pH under different saturation powers;
   (d) calculating a chemical exchange saturation transfer effect ratio R of the amide proton solution at each pH under different saturation powers;
   (e) establishing a function relation between pH and R; and
   (f) performing a phantom experiment or in vivo experiment to measure $R_i$, and calculating the desired pH according to $R_i$, and the function relation in Step (e).

4. The method for measuring pH according to claim 1, wherein amide proton solutions having different pH are prepared and then made into phantoms, and then the phantoms are subjected to a chemical exchange saturation transfer imaging experiment under different saturation powers.

5. The method for measuring pH according to claim 4, comprising steps of:
   (a) preparing amide proton solutions having different pH and then making them into several phantoms;
   (b) subjecting the phantoms to a chemical exchange saturation transfer imaging experiment under different saturation powers;
   (c) calculating chemical exchange saturation transfer effect MS of the amide proton solution at each pH under different saturation powers;
   (d) calculating a chemical exchange saturation transfer effect ratio R of the amide proton solution at each pH under different saturation powers;
   (e) establishing a function relation between pH and R; and
   (f) performing a phantom experiment or in vivo experiment to measure $R_i$, and calculating the desired pH according to $R_i$ and the function relation in Step (e).

6. The method for measuring pH according to claim 1, wherein a frequency offset range of the different saturation powers is ±3.5 ppm.

7. The method for measuring pH according to claim 6, comprising steps of:
   (a) preparing amide proton solutions having different pH and then making them into several phantoms;
   (b) subjecting the phantoms to a chemical exchange saturation transfer imaging experiment under different saturation powers;
   (c) calculating chemical exchange saturation transfer effect MS of the amide proton solution at each pH under different saturation powers;
   (d) calculating a chemical exchange saturation transfer effect ratio R of the amide proton solution at each pH under different saturation powers;
   (e) establishing a function relation between pH and R; and
   (f) performing a phantom experiment or in vivo experiment to measure $R_i$, and calculating the desired pH according to $R_i$ and the function relation in Step (e).

8. The method for measuring pH according to claim 1, wherein R is determined by $R=ST(\omega_1)/ST(\omega_2)=\{(M_0-M_{S1})\times M_{S2}\}/\{(M_0\times M_{S2})\times M_{S1}\}$, wherein $M_0$ is a signal amplitude when no saturation pulse is applied, $M_{S1}$ and $M_{S2}$ are chemical exchange saturation transfer effects when the saturation powers are $\omega_1$ and $\omega_2$, respectively, with $ST(\omega_1)=(M_0-M_{S1})/M_{S1}$, and $ST(\omega_2)=(M_0-M_{S2})/M_{S2}$.

9. The method for measuring pH according to claim 8, wherein $M_{S1}$ is determined by $M_{S1}=\{M_{S1}(-3.5\ ppm)-M_{S1}(+3.5\ ppm)\}/M_0$, wherein $M_0$ is a signal amplitude when no saturation pulse is applied, $M_{S1}(-3.5\ ppm)$ and $M_{S1}(+3.5\ ppm)$ are signal amplitudes at −3.5 ppm and +3.5 ppm when a saturation pulse is applied, respectively; and $M_{S2}$ is determined by $M_{S2}=\{M_{S2}(-3.5\ ppm)-M_{S2}(+3.5\ ppm)\}/M_0$; wherein $M_0$ is a signal amplitude when no saturation pulse is applied, and $M_{S2}(-3.5\ ppm)$ and $M_{S2}(+3.5\ ppm)$ are signal amplitudes at −3.5 ppm and +3.5 ppm when a saturation pulse is applied, respectively.

10. The method for measuring pH according to claim 9, comprising steps of:
    (a) preparing amide proton solutions having different pH and then making them into several phantoms;
    (b) subjecting the phantoms to a chemical exchange saturation transfer imaging experiment under different saturation powers;
    (c) calculating chemical exchange saturation transfer effect MS of the amide proton solution at each pH under different saturation powers;
    (d) calculating a chemical exchange saturation transfer effect ratio R of the amide proton solution at each pH under different saturation powers;
    (e) establishing a function relation between pH and R; and
    (f) performing a phantom experiment or in vivo experiment to measure $R_i$, and calculating the desired pH according to $R_i$ and the function relation in Step (e).

11. The method for measuring pH according to claim 8, comprising steps of:
    (a) preparing amide proton solutions having different pH and then making them into several phantoms;
    (b) subjecting the phantoms to a chemical exchange saturation transfer imaging experiment under different saturation powers;
    (c) calculating chemical exchange saturation transfer effect MS of the amide proton solution at each pH under different saturation powers;
    (d) calculating a chemical exchange saturation transfer effect ratio R of the amide proton solution at each pH under different saturation powers;
    (e) establishing a function relation between pH and R; and
    (f) performing a phantom experiment or in vivo experiment to measure $R_i$, and calculating the desired pH according to $R_i$ and the function relation in Step (e).

12. The method for measuring pH according to claim 1, wherein the function relation between pH and R refers to a function relation in the monotonically varying interval of pH and R,
    the function relation between pH and R is obtained by third order polynomial fitting.

13. The method for measuring pH according to claim 12, comprising steps of:
    (a) preparing amide proton solutions having different pH and then making them into several phantoms;
    (b) subjecting the phantoms to a chemical exchange saturation transfer imaging experiment under different saturation powers;
    (c) calculating chemical exchange saturation transfer effect MS of the amide proton solution at each pH under different saturation powers;
    (d) calculating a chemical exchange saturation transfer effect ratio R of the amide proton solution at each pH under different saturation powers;
    (e) establishing a function relation between pH and R; and (f) performing a phantom experiment or in vivo experiment to measure $R_i$, and calculating the desired pH according to $R_i$ and the function relation in Step (e).

14. The method for measuring pH according to claim 1, wherein the measurement of R of different pH-known amide proton solutions and the measurement of $R_i$, are performed at the same experimental temperature and under the same imaging conditions, and the in vivo experimental temperature is 37° C.

15. The method for measuring pH according to claim 14, comprising steps of:
    (a) preparing amide proton solutions having different pH and then making them into several phantoms;
    (b) subjecting the phantoms to a chemical exchange saturation transfer imaging experiment under different saturation powers;
    (c) calculating chemical exchange saturation transfer effect MS of the amide proton solution at each pH under different saturation powers;
    (d) calculating a chemical exchange saturation transfer effect ratio R of the amide proton solution at each pH under different saturation powers;
    (e) establishing a function relation between pH and R; and
    (f) performing a phantom experiment or in vivo experiment to measure $R_i$, and calculating the desired pH according to $R_i$, and the function relation in Step (e).

16. The method for measuring pH according to claim 1, comprising steps of:
    (a) loading amide proton solutions having different pH and then making the same into several phantoms;
    (b) subjecting the phantoms to a chemical exchange saturation transfer imaging experiment under different saturation powers;
    (c) calculating chemical exchange saturation transfer effect $M_s$ of the amide proton solution at each pH under different saturation powers;
    (d) calculating a chemical exchange saturation transfer effect ratio R of the amide proton solution at each pH under different saturation powers;
    (e) establishing a function relation between pH and R; and
    (f) performing a phantom experiment or in vivo experiment to measure $R_i$, and calculating the desired pH according to $R_i$, and the function relation in Step (e).

17. The method for measuring pH according to claim 1, comprising steps of:
    (a) preparing amide proton solutions having different pH and then making them into several phantoms;
    (b) subjecting the phantoms to a chemical exchange saturation transfer imaging experiment under different saturation powers;
    (c) calculating chemical exchange saturation transfer effect MS of the amide proton solution at each pH under different saturation powers;
    (d) calculating a chemical exchange saturation transfer effect ratio R of the amide proton solution at each pH under different saturation powers;
    (e) establishing a function relation between pH and R; and
    (f) performing a phantom experiment or in vivo experiment to measure $R_i$, and calculating the desired pH according to $R_i$ and the function relation in Step (e).

* * * * *